(12) United States Patent
Lu et al.

(10) Patent No.: US 12,469,765 B2
(45) Date of Patent: Nov. 11, 2025

(54) THERMALLY ENHANCED CHIP-ON-WAFER OR WAFER-ON-WAFER BONDING

(71) Applicant: Apple Inc., Cupertino, CA (US)

(72) Inventors: Jiongxin Lu, Cupertino, CA (US); Kunzhong Hu, Cupertino, CA (US); Jun Zhai, Cupertino, CA (US); Sanjay Dabral, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 520 days.

(21) Appl. No.: 17/934,346

(22) Filed: Sep. 22, 2022

(65) Prior Publication Data

US 2024/0105545 A1 Mar. 28, 2024

(51) Int. Cl.
| | |
|---|---|
| H01L 23/373 | (2006.01) |
| H01L 23/00 | (2006.01) |
| H01L 23/31 | (2006.01) |
| H01L 25/18 | (2023.01) |

(52) U.S. Cl.
CPC ...... *H01L 23/3738* (2013.01); *H01L 23/3185* (2013.01); *H01L 24/08* (2013.01); *H01L 24/29* (2013.01); *H01L 24/32* (2013.01); *H01L 25/18* (2013.01); *H01L 24/05* (2013.01); *H01L 24/80* (2013.01); *H01L 2224/05644* (2013.01); *H01L 2224/05647* (2013.01); *H01L 2224/08145* (2013.01); *H01L 2224/08225* (2013.01); *H01L 2224/29109* (2013.01); *H01L 2224/29111* (2013.01); *H01L 2224/29124* (2013.01); *H01L 2224/29139* (2013.01); *H01L 2224/29144* (2013.01); *H01L 2224/29147* (2013.01); *H01L 2224/32245* (2013.01); *H01L 2224/32503* (2013.01); *H01L 2224/80379* (2013.01)

(58) Field of Classification Search
CPC . H01L 23/3738; H01L 23/3185; H01L 24/08; H01L 24/29
See application file for complete search history.

(56) References Cited

U.S. PATENT DOCUMENTS

| | | |
|---|---|---|
| 6,845,184 B1 | 1/2005 | Yoshimura et al. |
| 10,170,429 B2 | 1/2019 | Huang et al. |
| 10,461,021 B2 | 10/2019 | Kinyanjui et al. |

(Continued)

FOREIGN PATENT DOCUMENTS

| | | |
|---|---|---|
| TW | 201737362 A | 10/2017 |
| TW | 201835271 A | 10/2018 |

(Continued)

OTHER PUBLICATIONS

PCT/US2023/031872, "PCT Notification of Transmittal of the International Search Report and the Written Opinion of the International Searching Authority, or the Declaration", mailed Dec. 26, 2023, 12 pages.

*Primary Examiner* — Dale E Page
*Assistant Examiner* — Wilner Jean Baptiste
(74) *Attorney, Agent, or Firm* — Aikin & Gallant, LLP

(57) ABSTRACT

Semiconductor packages including an integrated heat spreader and methods of fabrication are described. In an embodiment, a semiconductor package includes a first package level, a second package level including one or more second-level chiplets, and a heat spreader bonded to the second package level with a metallic layer, which may include one or more intermetallic compounds formed by transient liquid phase bonding.

20 Claims, 8 Drawing Sheets

(56) References Cited

U.S. PATENT DOCUMENTS

| | | | |
|---|---|---|---|
| 11,764,117 B2 * | 9/2023 | Bellman | H10F 39/011 257/99 |
| 2004/0124541 A1 | 7/2004 | Wu et al. | |
| 2005/0110131 A1 | 5/2005 | Lee | |
| 2006/0258120 A1 | 11/2006 | Gilroy et al. | |
| 2015/0021789 A1 | 1/2015 | Lin et al. | |
| 2016/0071818 A1 | 3/2016 | Wang et al. | |
| 2017/0092626 A1 | 3/2017 | Yuan et al. | |
| 2018/0294241 A1 * | 10/2018 | Chen | H01L 23/3128 |
| 2019/0252409 A1 | 8/2019 | Ritter et al. | |
| 2019/0355706 A1 | 11/2019 | Enquist et al. | |
| 2020/0071569 A1 | 3/2020 | Takeuchi et al. | |
| 2021/0084719 A1 | 3/2021 | Margavio et al. | |
| 2021/0125967 A1 | 4/2021 | Zhai | |
| 2021/0242104 A1 | 8/2021 | Mallik et al. | |
| 2021/0280511 A1 | 9/2021 | Tai et al. | |

FOREIGN PATENT DOCUMENTS

| | | |
|---|---|---|
| TW | 202113297 A | 4/2021 |
| WO | 2004027823 A2 | 4/2004 |
| WO | 2017100256 A1 | 6/2017 |

* cited by examiner

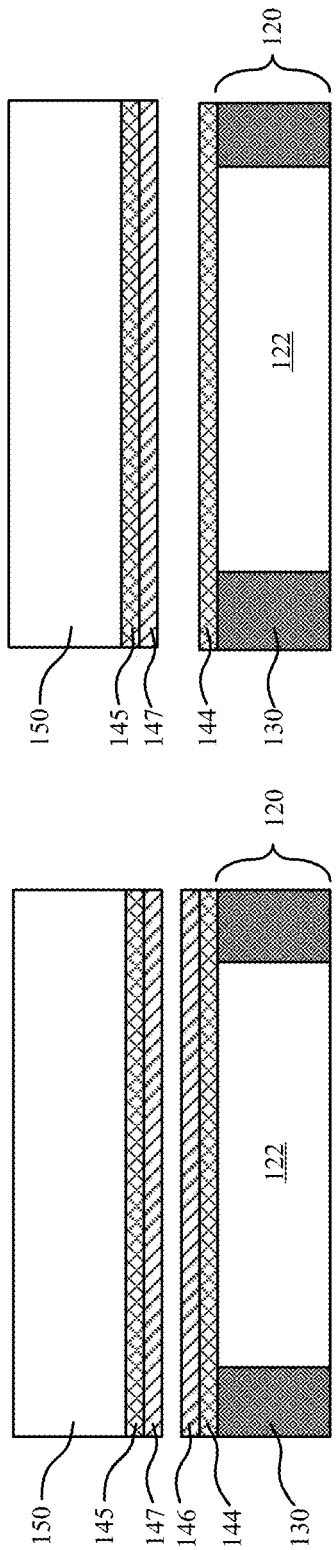
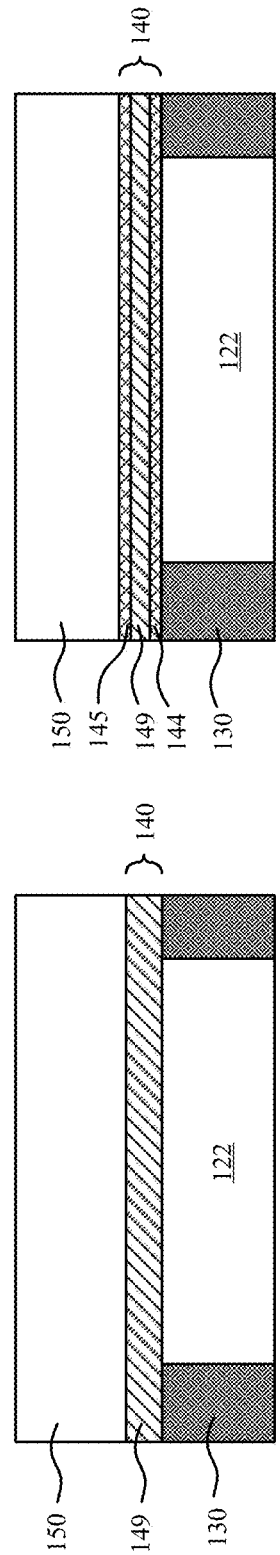

THERMALLY ENHANCED CHIP-ON-WAFER OR WAFER-ON-WAFER BONDING

BACKGROUND

Field

Embodiments described herein relate to integrated circuit (IC) manufacture, and the thermal performance of semiconductor packages.

Background Information

The current market demand for portable and mobile electronic devices such as mobile phones, personal digital assistants (PDAs), digital cameras, portable players, gaming, and other mobile devices requires the integration of more performance and features into increasingly smaller spaces. As a result, various multiple-die packaging solutions such as system in package (SiP) and package on package (PoP) have become more popular to meet the demand for higher die/component density devices.

There are many different possibilities for arranging multiple dies in an SiP. For example, integration of dies in SiP structures has evolved into 2.5D solutions and 3D solutions. In 2.5D solutions the multiple dies may be flip chip bonded on an interposer that includes through vias as well as fan out wiring. In various 3D solutions multiple dies may be stack on top of one another and connected with off-chip wire bonds or solder bumps. Wafer on wafer (WoW) or chip on wafer (CoW) techniques can also be utilized in the various 2.5D and 3D solutions to directly bond the dies with high density connections. For example, thermocompression bonding can be used to achieve metal-metal bonds, and hybrid bonding can be used to form oxide-oxide bonds along with the metal-metal bonds.

SUMMARY

Embodiments describe various semiconductor packages with integrated heat spreaders, such as permanent silicon substrate carriers. In an embodiment, a semiconductor package includes a first package level, a second package level including one or more second-level chiplets, and a heat spreader bonded to the second package level with a metallic layer. For example, the heat spreader may be formed from a silicon substrate and bonded to the second package level with transient liquid phase bonding (TLP). After singulation the semiconductor package may include straight package sidewalls spanning the first package level, the second package level, the metallic layer, and the heat spreader.

BRIEF DESCRIPTION OF THE DRAWINGS

FIGS. 2-3 are schematic cross-sectional side view illustrations of multiple bonding layers prior to bonding a heat spreader with a second package level in accordance with embodiments.

FIGS. 4A-4B are schematic cross-sectional side view illustration of a heat spreader bonded to a second package level with a metallic layer in accordance with embodiments.

DETAILED DESCRIPTION

Figure 1A:
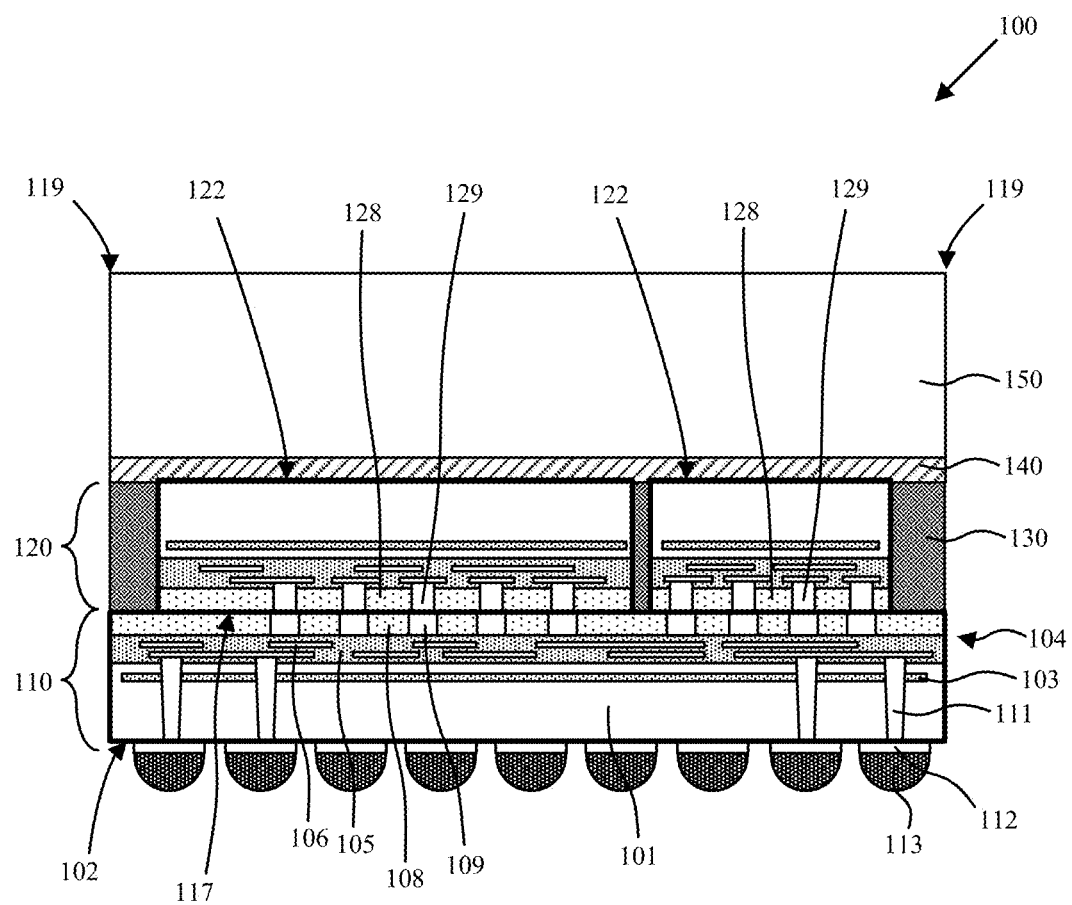
FIGS. 1A-1B are schematic cross-sectional side view illustrations of a semiconductor package with integrated heat spreader in accordance with embodiments.

Embodiments describe semiconductor package structures including multiple package levels and a heat spreader that is bonded to an upper package level with a metallic layer. For example, transient liquid phase bonding may be used to bond a silicon carrier wafer to a package level during fabrication. Upon singulation, the semiconductor package includes package sidewalls that span the multiple chip layers, the metallic layer, and the heat spreader formed by the bonded and singulated carrier wafer.

In one aspect, it has been observed that thermal performance for chip-on-wafer (CoW) and wafer-on-wafer (WoW) semiconductor package structures for high performance computing applications is important for both thermal dissipation and performance boost. For example, a three dimensional integrated circuit (3DIC) semiconductor package structure may include multiple package levels including one or more chiplets that have been direct bonded to another package level using thermal compression, fusion bonding or hybrid bonding. While such packaging techniques can result in a high density of connections, and fine bond pad pitch, it has been observed that these techniques can also result in package structures with closely assembled chiplets with limited avenues for heat dissipation.

In accordance with embodiments, silicon substrates may be integrated into the CoW or WoW packaging sequence as a carrier substrate and/or heat spreader. Furthermore, it has been observed that bonding of a silicon substrate to an underlying structure using an oxide layer, such as with fusion bonding, provides limited thermal performance as a heat spreader due to the low thermal conductivity of the oxide layer. In accordance with embodiments, transient liquid phase (TLP) bonding can be utilized to bond the silicon substrate where the resultant intermetallic compound(s) have a high thermal conductivity and high melting temperature that can withstand downstream thermal processes. TLP bonding can additionally be performed at significantly lower temperatures with higher throughput per hour compared to fusion bonding, and create a strong bond.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", "spanning" and "on" as used herein may refer to a relative position of one layer with respect to other layers. One layer "above", "over", "spanning" or "on" another layer or bonded "to" or in "contact" with another layer may be directly in contact with the other layer or may have one or more intervening layers. One layer "between" layers may be directly in contact with the layers or may have one or more intervening layers.

Figure 1B:
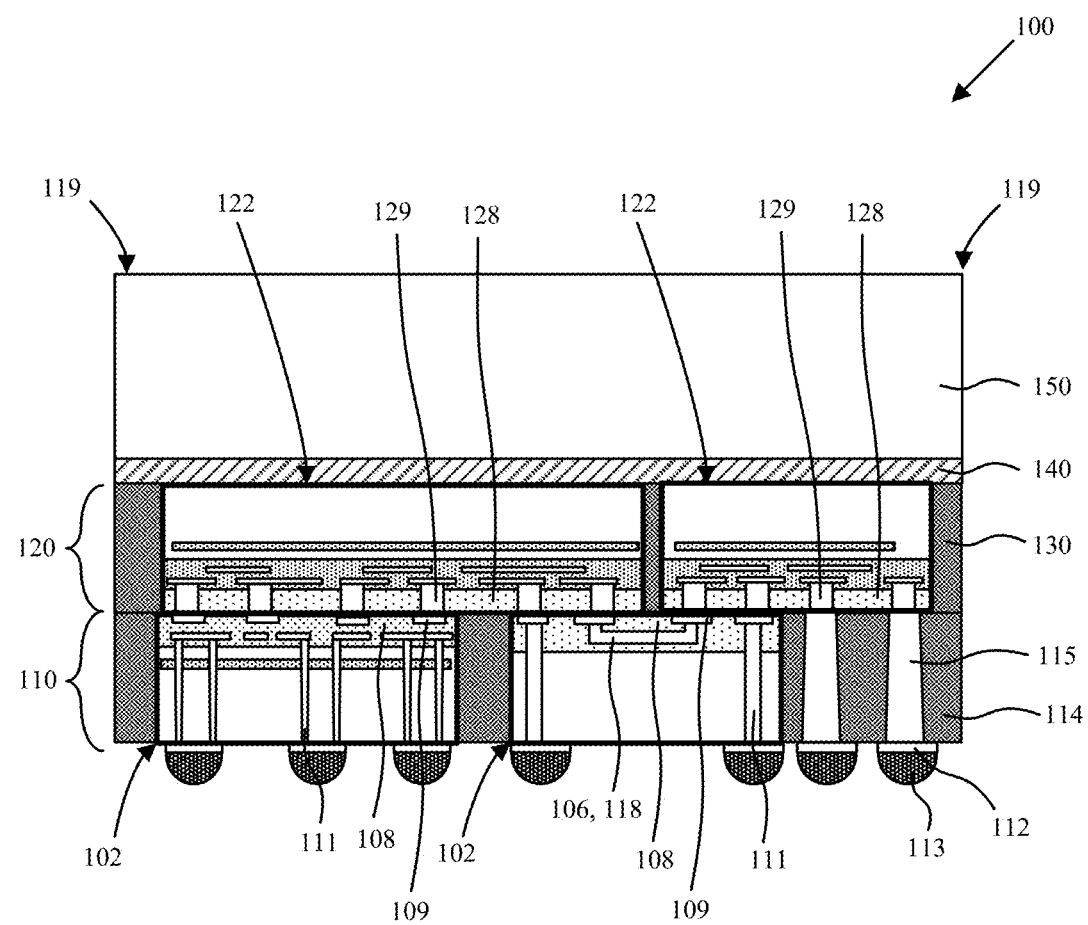

Referring now to FIGS. 1A-1B a cross-sectional side view illustrations are provided of semiconductor package 100 structures including a first package level 110 a second package level 120 including one or more second-level chiplets 122, and a heat spreader 150 bonded to the second package level with a metallic layer 140. As shown, straight package sidewalls 119 can span the first package level 110, the second package level 120, the metallic layer 140 and the heat spreader 150. For example, the straight package sidewalls 119 may be formed during singulation of one or more reconstituted package levels using a suitable technique such as wafer sawing, etching, etc.

The first package level 110 may include a planarized top surface 117 suitable for direct bonding of the second package level 120 (e.g. WoW) or one or more chiplets 122 (e.g. CoW) within the second package level 120. The first package level 110 may be an interposer substrate, such as with 2.5D packaging, or include one or more first-level chiplets 102, such as with 3D packaging. In the particular embodiments illustrated in FIGS. 1A-1B the first package level 110 includes one or more first-level chiplets 102, though this is exemplary and the CoW and WoW techniques in accordance with embodiments may be integrated with a variety of first package level structures. A variety of chiplets can be included in the first and/or second package levels depending upon application. Furthermore, the semiconductor packages in accordance with embodiments can facilitate die partitioning and process node optimization by integration of multiple chiplets into a single semiconductor package. Exemplary first-level chipets 102 and second-level chipets 122 can include a moderate power die (or low power) such as a system-on-chip (SOC), power management integrated circuit (PMIC), a low speed input/output (LSIO) die, high speed input/output (HSIO) die, and one or more high power dies such as a graphics processing unit (GPU), central processing unit (CPU), artificial intelligence (AI), machine learning logic, cache die, silicon interconnect to support die-to-die routing, and any combinations thereof.

In the particular embodiment illustrated in FIG. 1A the semiconductor package 100 area is defined by the footprint of the first package level 110 (e.g. interposer, or the first-level chiplet 102 as illustrated), over which one or more second-level chiplets 122 can be integrated. In the particular embodiment illustrated in FIG. 1B the semiconductor package 100 can include multiple first-level chiplets 102, and thus area for the semiconductor package 100 is not defined by the size of a single first-level chiplet 102 (or interposer).

Referring to FIG. 1A, in the particular embodiment illustrated the semiconductor package 100 includes a first-level chiplet 102 within the first package level 110. The first-level chiplet 102 may include a semiconductor substrate 101 and back-end-of-the-line (BEOL) build-up structure 104. The BEOL build-up structure 104 can include one or more metal wiring layers 106 and dielectric layers 105, including a top oxide layer 108 and contact pads 109 for hybrid bonding. The BEOL build-up structure 104 may be formed over an active region 103 in the semiconductor substrate to connect with various devices (e.g. transistors, etc.) formed in the semiconductor substrate. A plurality of through vias 111 (e.g. through silicon vias (TSVs)) may also be formed through the semiconductor substrate 101 to connect the BEOL build-up structure 104 or active region to pads 112 on a back side of the first-level chiplet. It is to be appreciated that a first-level silicon interposer may be similarly formed, thus the illustration of FIG. 1A can be considered as including either a first-level chiplet 102 or interposer.

Referring now to FIG. 1B, in the particular embodiment illustrated semiconductor package 100 includes multiple first-level chiplets 102 within the first package level 110. The multiple first-level chiplets 102 may be embedded in a gap fill material 114 such as a polymer molding compound material, or oxide materials. For example, this may be accomplished through a wafer reconstitution process. Through vias 115 may additionally extend through the gap fill material 114 to provide electrical connection to the second package level 120. The through vias 115 may be through mold vias (TMVs), through oxide vias (TOVs), through dielectric vias (TDVs) or stand-alone printed circuit board (PCB) bars, etc. In an embodiment, the first-level chiplets 102 can include a silicon interconnect chiplet, including die-to-die routing 118 for connection between multiple second-level chiplets 122.

As shown in both FIGS. 1A-1B the second package level 120 can include multiple second-level chiplets 122 embedded in a gap fill material 130, which can be formed similarly as the gap fill material 114. Each of the second-level chiplets 122 may also include a top oxide layer 128 and contact pads 129 for hybrid bonding with the first package level 110. In accordance with embodiments, the second-level chiplets 122 may be bonded with the first package level 110 using a suitable technique such as chip-on-wafer (CoW) bonding. Alternatively, the second package level 120 can be bonded with the first package level 110 using a suitable technique such as wafer-on-wafer (WoW) bonding. In both techniques hybrid bonding may be used to form oxide-oxide and metal-metal bonds (copper-copper bonds, gold-gold bonds, etc.) or alternatively thermocompression bonding may be used to form the metal-metal bonds.

In accordance with embodiments, a heat spreader 150 is bonded to the second package level 120 with a metallic layer 140. The heat spreader 150 may be formed of a variety of thermally conductive materials, including metal, silicon, etc. In a particular embodiment the heat spreader 150 is formed from a silicon substrate, which can optionally be utilized during fabrication as a carrier wafer during CoW or WoW bonding. As such, the heat spreader 150 may be diced/singulated along with the semiconductor package such that the semiconductor package includes straight package sidewalls 119 spanning the first package level 110, the second package level 120, the metallic layer 140, and the heat spreader 150.

In accordance with embodiments the heat spreader 150 may be bonded using transient liquid phase (TLP) bonding where one or more intermetallic compounds are formed by interdiffusion of bonding layers. Referring now to FIGS. 2-3 schematic cross-sectional side view illustrations are provided of multiple bonding layers prior to bonding a heat spreader with a second package level in accordance with embodiments. As shown, bottom and top metal bonding layers 144, 145 may be first deposited onto the second package level 120 and the heat spreader 150, respectively. For example, the bottom metal bonding layer 144 may be deposited directly onto the one or more second-level chiplets 122 and gap fill material 130. Top metal bonding layer 145 may be deposited directly onto a silicon substrate as the heat spreader 150. Bottom and top metal bonding layers 144, 145 may be formed by first depositing a seed layer, then bulk growth or deposition using a suitable technique. The bottom and top metal bonding layers 144, 145 may be formed of a material such as Cu, Al, Ag, and Au.

This may be followed by deposition of one or more second metal bonding layers 146, 147 on either or both of the first metal bonding layers 144, 145. The second metal bonding layer(s) may be formed of a material such as In or Sn, characterized by a lower melting temperature than the bottom and top metal bonding layers. Lower melting temperatures, such as below 235° C., may facilitate processability. The two substrates may then be brought together under heat and pressure to reflow the second metal bonding layer(s) where the second metal bonding layer(s) diffuse into the bottom and top metal bonding layers 144, 145 causing isothermal solidification and the formation of one or more intermetallic compounds characterized by a higher melting temperature than the bonding temperature (and hence higher than the melting temperature of the second bonding layer(s). Thus, the intermetallic compound(s) completely consumes the second bonding layer(s). In an embodiment, the intermetallic compound(s) include $Cu_3Sn$.

Referring now to FIG. 4A, in an embodiment the top and bottom metal bonding layers 146, 147 (and seed layers) are completely consumed by the intermetallic compound(s), and the intermetallic compound(s) 149 are in direct contact with the heat spreader 150 and the second package level 120 (e.g. the plurality of second-level chiplets 122 and gap fill material 130). The second metal bonding layer(s) may also be completely consumed without completely consuming the bottom or top metal bonding layers 144, 145 as shown in FIG. 4B, where a layer of intermetallic compound(s) 149 is shown between remaining thicknesses of the bottom and top metal bonding layers 144, 145.

Figure 5A:
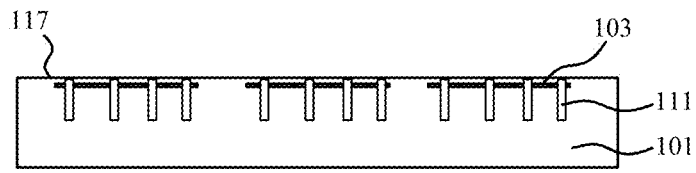
FIGS. 5A-5E are schematic cross-sectional side view illustrations of a method of forming a semiconductor package with CoW chiplet bonding and an integrated heat spreader in accordance with an embodiment.
Figure 5B:
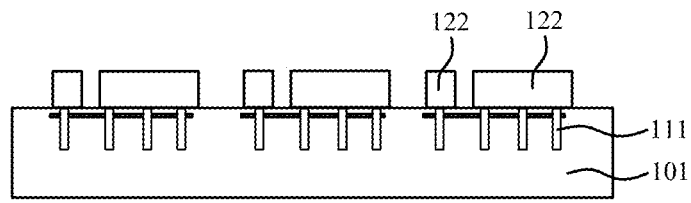
Figure 5C:
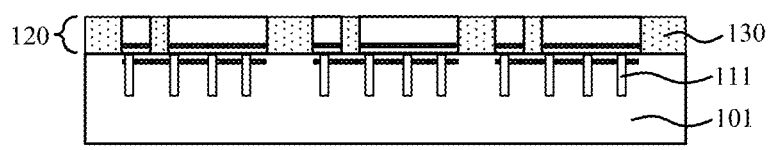
Figure 5D:
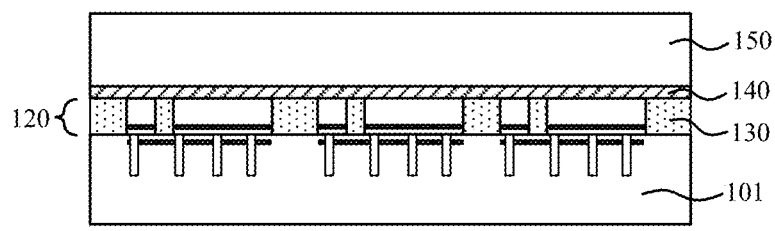
Figure 5E:
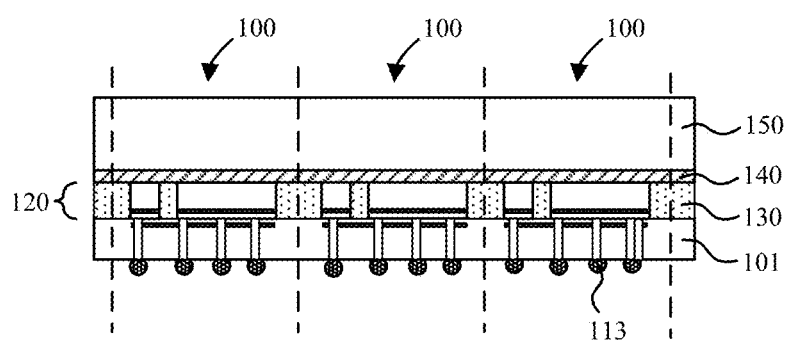

Referring now to FIGS. 5A-5E schematic cross-sectional side view illustrations are provided of a method of forming a semiconductor package with CoW chiplet bonding and an integrated heat spreader in accordance with an embodiment. In particular, the process sequence may be utilized to form a semiconductor package 100 such as that of FIG. 1A. It is to be appreciated however, that other processing sequences may be used to form the semiconductor package 100 of FIG. 1A, such as a sequence including WoW bonding of the second package level 120. As shown in FIG. 1A, the sequence may begin with a semiconductor substrate 101, such as silicon wafer, including optional active regions 103 and through vias 111 at least partially through the semiconductor substrate 101. A plurality of second-level chiplets 122 can then be bonded to the planarized surface 117, for example with TCB or hybrid bonding. This may be followed by deposition of a gap fill material 130, such as oxide, nitride (e.g. SiN) or organic molding compound and optionally planarizing to expose the back sides of the chiplets 122 as shown in FIG. 5C. The heat spreader 150 can then be bonded to the second package level 120 with metallic layer 140 using TLP bonding as shown in FIG. 5D. In an embodiment, the heat spreader 150 is a silicon carrier substrate that can provide mechanical support for the following processes. The semiconductor substrate 101 may then be thinned to expose the through vias 111, followed by formation of contact pads and solder bumps 113 as shown in FIG. 5E. The stack-up may then be singulated into multiple semiconductor packages 100 as shown with the dashed lines.

Referring now to FIGS. 6A-6B, FIGS. 7A-7C, and FIG. 8 schematic cross-sectional side view illustrations are provided of a method of forming a semiconductor package with reconstituted WoW bonding and an integrated heat spreader in accordance with an embodiment. In particular, the process sequence may be utilized to form a semiconductor package 100 such as that of FIG. 1B. It is to be appreciated however, that other processing sequences may be used to form the semiconductor package 100 of FIG. 1B, such as a sequence including CoW bonding of the first-level chiplets 102 or second-level chiplets 122 onto a reconstituted package level.

Figure 6A:
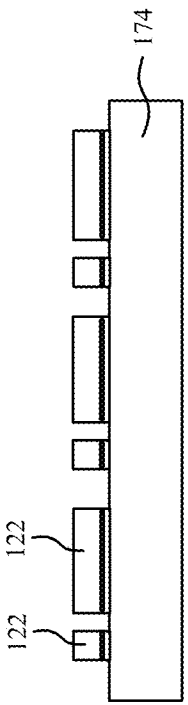
FIGS. 6A-B are schematic cross-sectional side view illustrations of a method of forming a reconstituted first package level in accordance with an embodiment.
Figure 6B:
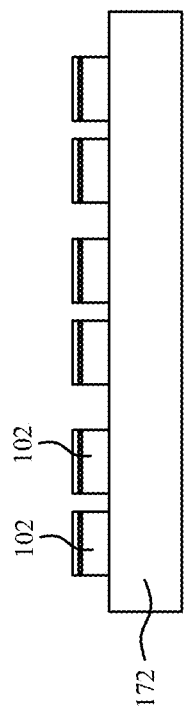

FIGS. 6A-B are schematic cross-sectional side view illustrations of a method of forming a reconstituted first package level 110 in accordance with an embodiment. As shown in FIG. 6A, the sequence may begin with mounting first-level chiplets 102 into a carrier substrate 172. In the particular embodiment illustrated the first-level chiplets 102 are mounted face up, though they can also be mounted face down, for example where one is thinner than the other. A gap fill material 114 such as an oxide or organic molding compound material is then formed over the first-level chiplets 102 as shown in FIG. 6B. Through vias 115 may also be formed through the gap fill material 114, or formed (e.g. as copper pillars) prior to the gap fill material 114. A top surface 117 may then be planarized to expose contact pads 109 of the first package level 110, and optionally through vias 115, and condition the top surface 117 for TCB or hybrid bonding. Where the first-level chiplets 102 are alternatively placed face down, then the original carrier substrate 172 can be removed after formation of the gap fill material, followed by attaching a second carrier substrate on the opposite side, removal of the original carrier substrate 172, and planarizing the top surface 117.

Figure 7A:
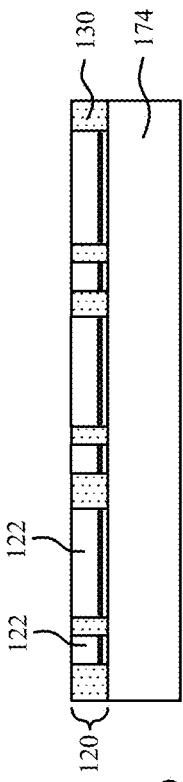
FIGS. 7A-7C are schematic cross-sectional side view illustrations of a method of forming a reconstituted second package level with integrated heat spreader in accordance with an embodiment.
Figure 7B:
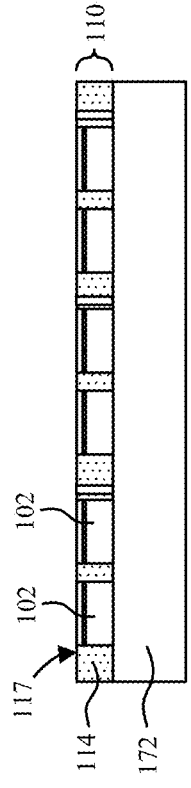
Figure 7C:
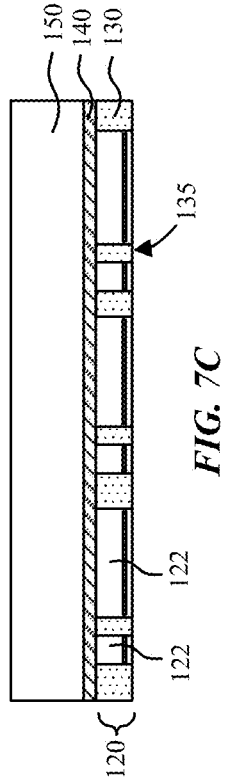

FIGS. 7A-7C are schematic cross-sectional side view illustrations of a method of forming a reconstituted second package level 120 with integrated heat spreader in accordance with an embodiment. As shown in FIG. 7A, the sequence may begin with mounting second-level chiplets 122 into a carrier substrate 174. In the particular embodiment illustrated the second-level chiplets 122 are mounted face down, though they can also be mounted face up. A gap fill material 130 such as an oxide, nitride (e.g. SiN) or organic molding compound material is then formed over the second-level chiplets 122 as shown in FIG. 7B. This may be followed by thinning to expose the back sides of the second-level chiplets 122. A heat spreader 150 can then be bonded to the second package level 120 with metallic layer 140 using TLP bonding as shown in FIG. 7C. In an embodiment, the heat spreader 150 is a silicon carrier substrate that can provide mechanical support for the following processes. The carrier substrate 174 may then be removed, followed by planarization of surface 135 to expose contact pads 129 on the second package level 120, and condition the surface 135 for TCB or hybrid bonding.

Figure 8:
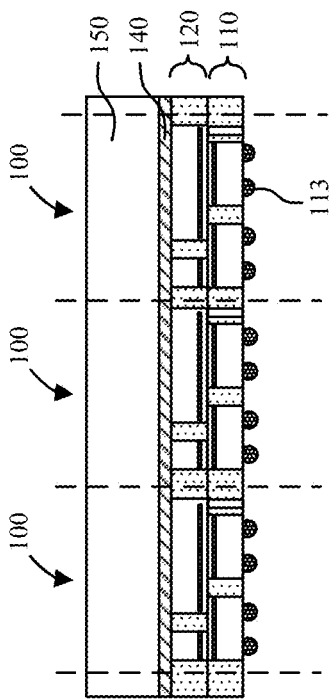
FIG. 8 is a schematic cross-sectional side view illustration of reconstituted WoW bonding with an integrated heat spreader in accordance with and embodiment.

Referring now to FIG. 8 the reconstituted package levels can then be bonded to one another with WoW bonding. Additional processing such as addition of solder bumps or Cu pillar bumps 113 may be performed, followed by singulation into semiconductor packages 100. It is to be appreciated that while WoW bonding is illustrated, each of the reconstituted package levels could also be used to support CoW bonding of chiplets from the other package level.

Figure 9:
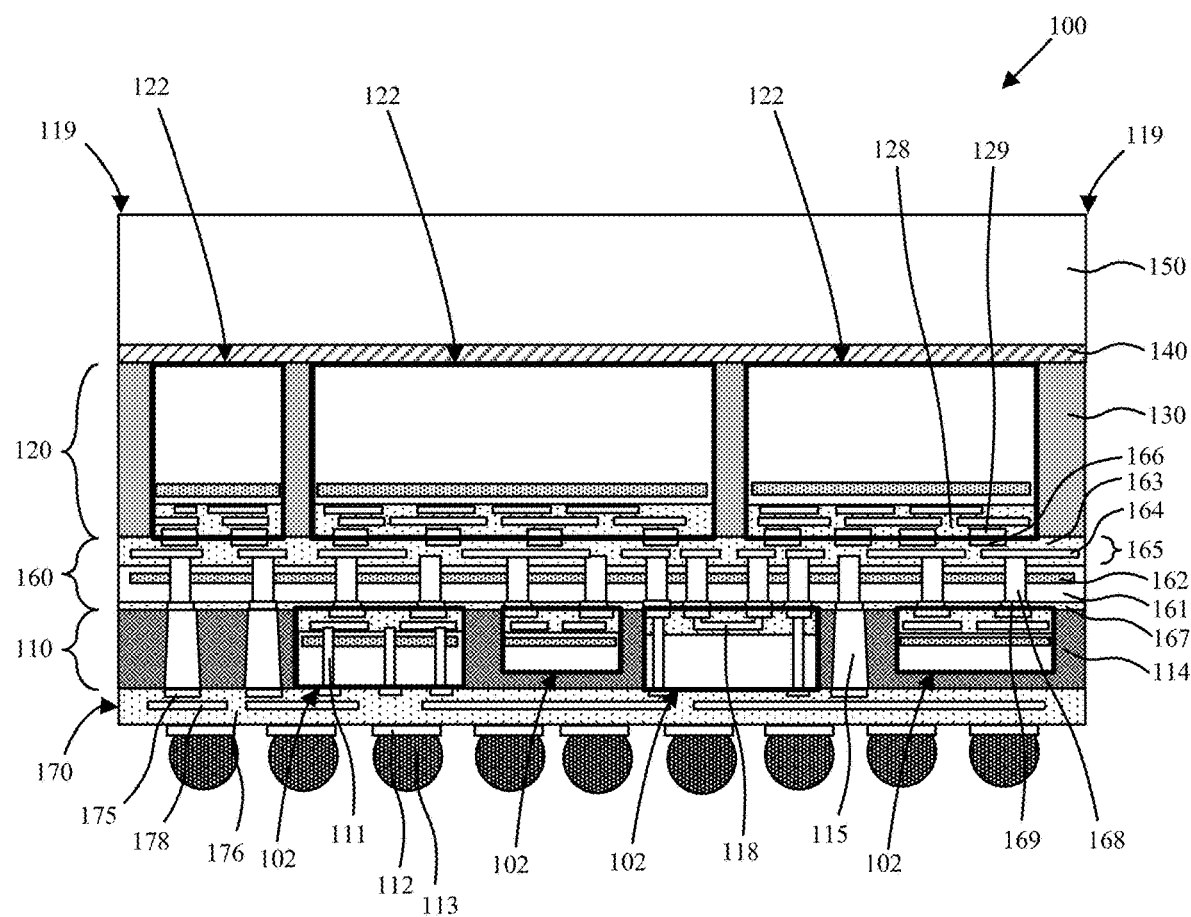
FIG. 9 is a schematic cross-sectional side view illustration of a semiconductor package with intermediate interposer and integrated heat spreader in accordance with an embodiment.

FIG. 9 is a schematic cross-sectional side view illustration of a semiconductor package 100 with intermediate interposer 160 and integrated heat spreader 150 in accordance with an embodiment. The semiconductor package 100 illustrated in FIG. 9 is similar to the semiconductor package illustrated in FIG. 1B, including multiple chiplets in each of the first package level 110 and second package level 120. The embodiment illustrated in FIG. 9 additionally illustrates an intermediate interposer 160 to which the multiple chiplets or package levels can be TCB or hybrid bonded to. The intermediate interposer may provide additional routing area, allowing for die partitioning and process node optimization, as well as flexibility for power delivery and integration of passive devices into the semiconductor package.

The intermediate interposer 160 in accordance with embodiments can include a bulk silicon layer 161 and an interposer BEOL build-up structure 165 formed similarly as those described for the chiplets in the first and second package levels, including one or more dielectric layers 163 and metal wiring layers 164. A topmost dielectric layer may be an oxide layer. A planarized surface may extend across the topmost dielectric layer and landing pads 166 to facilitate hybrid bonding. Similarly, a back-side oxide layer 167 and contact pads 169 with a planarized surface may be formed on the underside of the bulk silicon layer 161 for hybrid bonding with components in the first package level 110. A plurality of through silicon vias 168 can extend through the bulk silicon layer 161 (and back-side oxide layer 167) to the BEOL build-up structure. The intermediate interposer 160 may additionally include a plurality of devices 162, including passive devices such as MIM capacitors or trench capacitors, or even active devices such as transistors. In an embodiment, the intermediate interposer includes an array of trench capacitors. Alternative materials may also be used in place of the bulk silicon layer 161, such as glass or other non-silicon materials.

The semiconductor package 100 of FIG. 9 may be fabricated using a variety of processing sequences, including CoW and WoW techniques for either or both of the first package level 110 and second package level 120 as previously described. Also shown in FIG. 9 is an optional backside redistribution layer (RDL) 170 which may be formed on the first package level 110. The backside RDL may include contact pads 175 for connection to the first package level 110, as well as one or more metal routing layers 178 and dielectric layers 176. Pads 112 as previously described may be included in the backside RDL 170.

Figure 10:
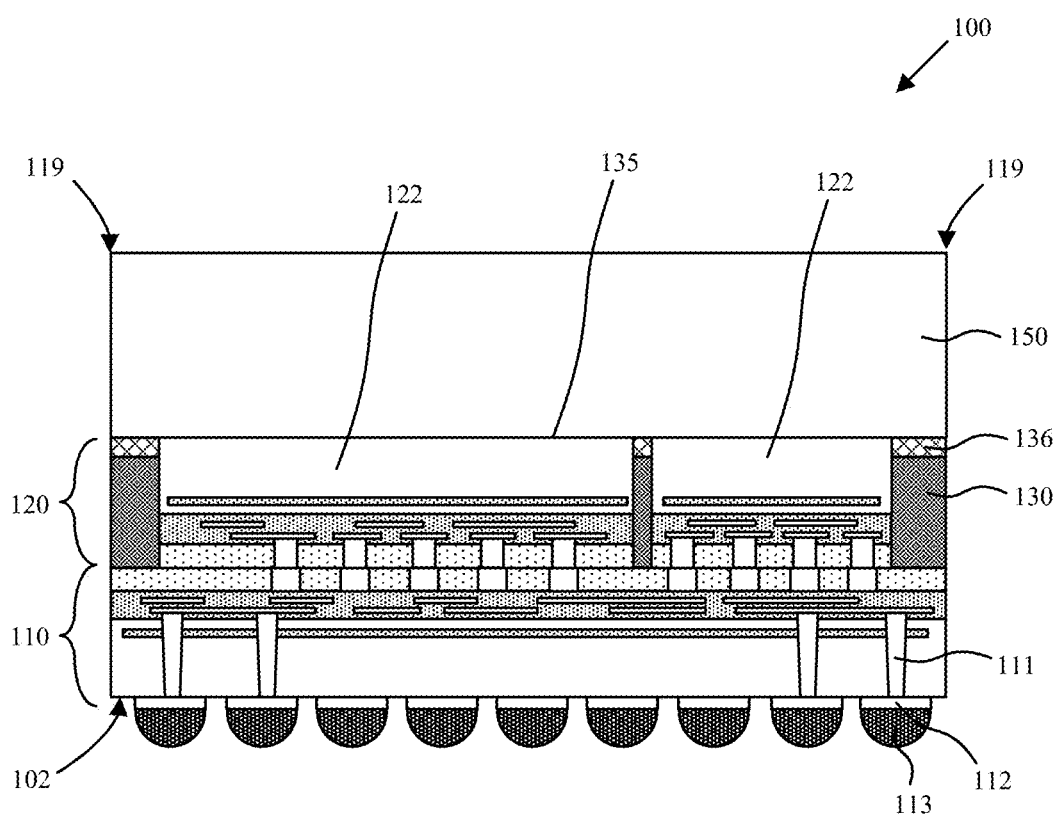
FIG. 10 is schematic cross-sectional side view illustration of a semiconductor package with an integrated heat spreader bonded to a silicon gap fill material in accordance with an embodiment.

Up until this point semiconductor packages 100 have been described in which a heat spreader 150 is integrated with TLP bonding. In an alternative configuration illustrated in FIG. 10, a multiple layer gap fill may be utilized to facilitate silicon-silicon bonding with activated surfaces. In interest of conciseness, FIG. 10 is similar to the embodiment illustrated in FIG. 1A where gap fill material 130 does not entirely cover each second-level chiplet 122. In the illustrated embodiment, a capping gap fill material 136 may be formed over the bulk gap fill material 130, followed by planarization. The capping gap fill material 136 may be formed of silicon, such as an amorphous silicon or semicrystalline silicon material. After surface activation, the heat spreader 150 (silicon wafer) can be bonded to the planarized surface 135 of silicon materials including capping gap fill material 136 and chiplets 122.

Figure 11:
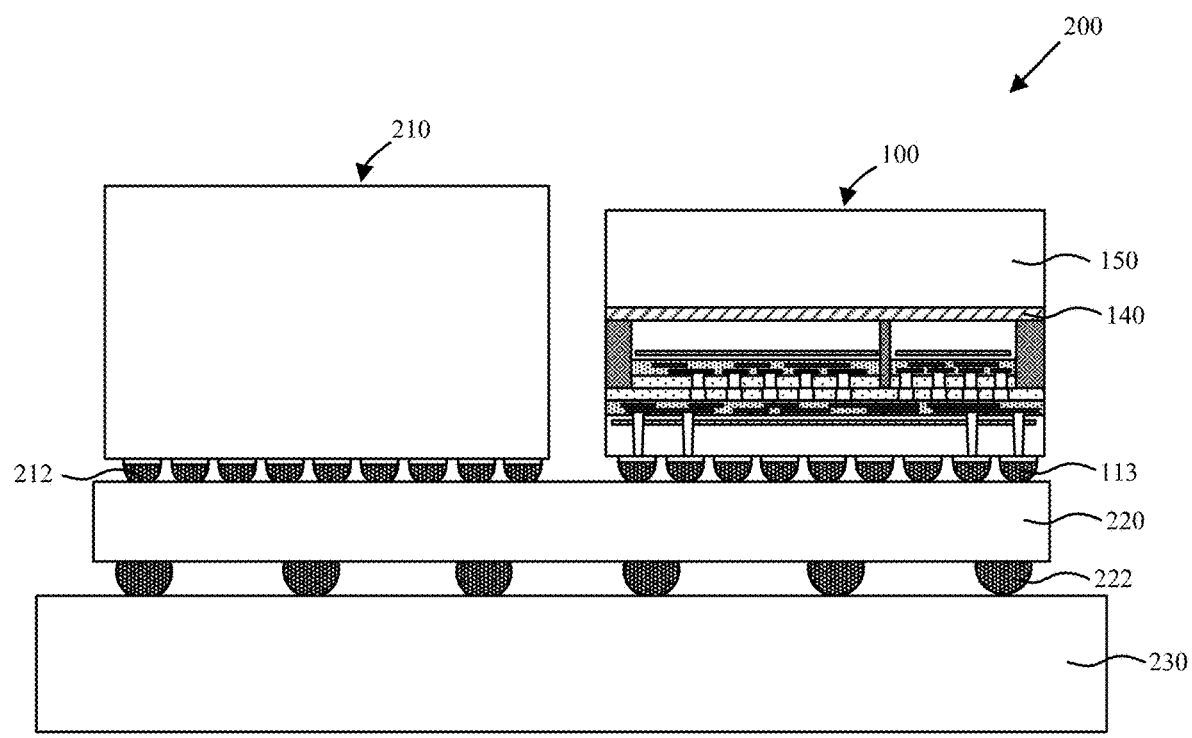
FIG. 11 is a schematic cross-sectional side view illustration of a multi-chip module system including a semiconductor package with integrated heat spreader in accordance with an embodiment.

Referring now to FIG. 11, the various semiconductor packages 100 in accordance with embodiments may be integrated into a multi-chip module system 200. For example, such a system may include a module substrate 220 upon which the semiconductor package 100 and another component 210 such as memory package are flip chip bonded using solder bumps 113, 212. The module substrate 220 in turn may be bonded to a printed circuit board 230 using a suitable technique such as solder balls 222, or pins.

In utilizing the various aspects of the embodiments, it would become apparent to one skilled in the art that combinations or variations of the above embodiments are possible for forming a 3DIC with integrated heat spreader. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A semiconductor package comprising:
a first package level;
a second package level including one or more second-level chiplets;
a heat spreader bonded to the second package level with a metallic layer; and
straight package sidewalls spanning the first package level, the second package level, the metallic layer, and the heat spreader;
wherein the metallic layer comprises:
a first element selected from the group consisting of Cu, Al, Ag, and Au; and
a second element selected from the group consisting of In and Sn, and the second element is completely contained within one or more intermetallic compounds.

2. The semiconductor package of claim 1, wherein the heat spreader is a silicon substrate.

3. The semiconductor package of claim 1, wherein the first package level and the second package level are hybrid bonded to one another.

4. The semiconductor package of claim 1, wherein the one or more second-level chiplets is hybrid bonded to the first package level.

5. The semiconductor package of claim 1, further comprising an interposer between the first package level and the second package level.

6. The semiconductor package of claim 5, wherein the interposer is hybrid bonded with the first package level.

7. The semiconductor package of claim 6, wherein the second package level is hybrid bonded with the interposer.

8. The semiconductor package of claim 1, wherein the first package level comprises an interposer.

9. The semiconductor package of claim 1, wherein the first package level comprises a single first-level chiplet.

10. The semiconductor package of claim 1, wherein the first package level comprises a plurality of first-level chiplets.

11. The semiconductor package of claim 1, wherein
the one or more second-level chiplets is embedded in a multiple layer gap fill including a bulk gap fill material and a capping gap fill material comprising silicon; and
the heat spreader is a silicon substrate.

12. The semiconductor package of claim 1, further comprising an interposer between the first package level and the second package level, wherein the one or more second-level chiplets is hybrid bonded with the interposer, and the first package level comprises one or more first-level chiplets hybrid bonded with the interposer.

13. The semiconductor package of claim 12, wherein the heat spreader comprises a silicon substrate, and the interposer comprises a bulk layer formed of a material selected from the group consisting of silicon and glass.

14. The semiconductor package of claim 1, wherein the first package level comprises an interposer with a bulk layer formed of a material selected from the group consisting of silicon and glass, and the one or more second-level chiplets is hybrid bonded with the interposer.

15. The semiconductor package of claim 2, wherein the one or more intermetallic compounds comprises the first element and the second element.

16. The semiconductor package of claim 2, wherein the one or more second-level chiplets is a plurality of second level chiplets.

17. The semiconductor package of claim 16, wherein the plurality of second-level chiplets is embedded in a gap fill material, and the metallic layer spans over and is in direct contact with the gap fill material and the plurality of second-level chiplets.

18. The semiconductor package of claim 17, wherein the one or more intermetallic compounds is in direct contact with the heat spreader and the plurality of second-level chiplets.

19. The semiconductor package of claim 18, wherein the gap fill material is an organic molding compound material or SiN.

20. The semiconductor package of claim 18, wherein the metallic layer comprises a top metal bonding layer directly on the heat spreader, a bottom metal bonding layer directly on the plurality of second-level chiplets and the gap fill material, and a layer of the one or more intermetallic compounds between the top metal bonding layer and the bottom metal bonding layer.

* * * * *